United States Patent … US 10,103,121 B2
Uzoh et al. … Oct. 16, 2018

(54) TALL AND FINE PITCH INTERCONNECTS

(71) Applicant: Invensas Corporation, San Jose, CA (US)

(72) Inventors: Cyprian Emeka Uzoh, San Jose, CA (US); Rajesh Katkar, Milpitas, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 15/831,231

(22) Filed: Dec. 4, 2017

(65) Prior Publication Data

US 2018/0096960 A1   Apr. 5, 2018

Related U.S. Application Data

(63) Continuation of application No. 14/832,996, filed on Aug. 21, 2015, now Pat. No. 9,842,819.

(51) Int. Cl.
*H01L 23/00* (2006.01)
*H01L 25/00* (2006.01)
(Continued)

(52) U.S. Cl.
CPC .......... *H01L 24/17* (2013.01); *H01L 21/6835* (2013.01); *H01L 24/11* (2013.01); *H01L 24/13* (2013.01); *H01L 24/14* (2013.01); *H01L 24/73* (2013.01); *H01L 24/81* (2013.01); *H01L 25/0657* (2013.01); *H01L 25/50* (2013.01); *H05K 3/3478* (2013.01); *H01L 24/03* (2013.01); *H01L 24/05* (2013.01); *H01L 24/16* (2013.01); *H01L 24/32* (2013.01); *H01L 2221/68372* (2013.01); *H01L 2224/034* (2013.01); *H01L 2224/03612* (2013.01); *H01L 2224/0401* (2013.01); *H01L 2224/05124* (2013.01); *H01L 2224/05147* (2013.01); *H01L 2224/05644* (2013.01); *H01L 2224/05655* (2013.01); *H01L 2224/05666* (2013.01); *H01L 2224/1012* (2013.01); *H01L 2224/10155* (2013.01); *H01L 2224/111* (2013.01);
(Continued)

(58) Field of Classification Search
CPC ..... H01L 21/6835; H01L 24/11; H01L 24/13; H01L 24/14; H01L 24/17; H01L 24/73; H01L 24/81; H01L 25/0657; H01L 25/50
USPC .......................................... 438/107; 257/737
See application file for complete search history.

(56) References Cited

U.S. PATENT DOCUMENTS 5,374,893 A * 12/1994 Koopman .......... G01R 31/2863
                                                      324/750.05
5,912,505 A    6/1999 Itoh et al.
(Continued)

FOREIGN PATENT DOCUMENTS

EP    1369919 A1    12/2003
EP    1386356 B1    4/2007

*Primary Examiner* — Brook Kebede

(57) ABSTRACT

Representative implementations of devices and techniques provide interconnect structures and components for coupling various carriers, printed circuit board (PCB) components, integrated circuit (IC) dice, and the like, using tall and/or fine pitch physical connections. Multiple layers of conductive structures or materials are arranged to form the interconnect structures and components. Nonwettable barriers may be used with one or more of the layers to form a shape, including a pitch of one or more of the layers.

19 Claims, 10 Drawing Sheets

(51) Int. Cl.
*H01L 21/683* (2006.01)
*H01L 25/065* (2006.01)
*H05K 3/34* (2006.01)

(52) U.S. Cl.
CPC .............. *H01L 2224/11003* (2013.01); *H01L 2224/114* (2013.01); *H01L 2224/116* (2013.01); *H01L 2224/119* (2013.01); *H01L 2224/1111* (2013.01); *H01L 2224/1112* (2013.01); *H01L 2224/11013* (2013.01); *H01L 2224/1132* (2013.01); *H01L 2224/1144* (2013.01); *H01L 2224/1147* (2013.01); *H01L 2224/1161* (2013.01); *H01L 2224/11334* (2013.01); *H01L 2224/11438* (2013.01); *H01L 2224/11849* (2013.01); *H01L 2224/11912* (2013.01); *H01L 2224/131* (2013.01); *H01L 2224/133* (2013.01); *H01L 2224/1308* (2013.01); *H01L 2224/13014* (2013.01); *H01L 2224/1329* (2013.01); *H01L 2224/13083* (2013.01); *H01L 2224/13084* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13171* (2013.01); *H01L 2224/13181* (2013.01); *H01L 2224/13184* (2013.01); *H01L 2224/13187* (2013.01); *H01L 2224/13655* (2013.01); *H01L 2224/13666* (2013.01); *H01L 2224/13671* (2013.01); *H01L 2224/13681* (2013.01); *H01L 2224/13684* (2013.01); *H01L 2224/1401* (2013.01); *H01L 2224/1403* (2013.01); *H01L 2224/16145* (2013.01); *H01L 2224/16225* (2013.01); *H01L 2224/16227* (2013.01); *H01L 2224/32145* (2013.01); *H01L 2224/32225* (2013.01); *H01L 2224/73204* (2013.01); *H01L 2224/81101* (2013.01); *H01L 2224/81191* (2013.01); *H01L 2224/81192* (2013.01); *H01L 2224/81193* (2013.01); *H01L 2224/81815* (2013.01); *H01L 2224/92125* (2013.01); *H01L 2225/06513* (2013.01); *H01L 2924/014* (2013.01); *H01L 2924/0105* (2013.01); *H01L 2924/01014* (2013.01); *H01L 2924/01029* (2013.01); *H01L 2924/01082* (2013.01); *H01L 2924/0781* (2013.01); *H01L 2924/381* (2013.01); *H05K 3/3436* (2013.01); *H05K 2203/0415* (2013.01)

(56) References Cited

U.S. PATENT DOCUMENTS

| | | |
|---|---|---|
| 6,002,177 A | 12/1999 | Gaynes et al. |
| 6,184,581 B1 | 2/2001 | Cornell et al. |
| 6,410,415 B1 | 6/2002 | Estes |
| 6,543,129 B2 | 4/2003 | Cachina et al. |
| 7,125,789 B2 | 10/2006 | Tellkamp et al. |
| 7,141,879 B2 | 11/2006 | Wakamiya et al. |
| 7,994,636 B2 | 8/2011 | Pendse |
| 8,101,470 B2 | 1/2012 | Poddar et al. |
| 8,129,841 B2 | 3/2012 | Pendse et al. |
| 8,283,781 B2 | 10/2012 | Wu et al. |
| 8,604,624 B2 | 12/2013 | Kim et al. |
| 9,035,461 B2 | 5/2015 | Hu |
| 9,646,923 B2 | 5/2017 | Tseng et al. |
| 2007/0105277 A1 | 5/2007 | Pendse et al. |
| 2009/0108443 A1 | 4/2009 | Jiang |
| 2012/0306073 A1* | 12/2012 | Yu .................... H01L 23/147 257/737 |

* cited by examiner

TALL AND FINE PITCH INTERCONNECTS

CROSS-REFERENCE TO RELATED APPLICATION(S)

This application is a continuation of U.S. patent application Ser. No. 14/832,996, filed Aug. 21, 2015, the entirety of which is incorporated by reference herein for all purposes.

BACKGROUND

Integrated circuits (IC), and the like, use various components and structures to interconnect (e.g., power, ground, signals, data, etc.) with other ICs, carriers, printed circuit boards (PCB) and components, and so forth. For example, connections may be made using contact pads, sockets or terminals, wire bonds, and other components. In the case of "flip chips," interconnects are often solder bumps or metallic posts protruding from a surface of the chip package.

As IC chip technology matures, smaller packages are possible due to smaller and denser ICs. Finer pitch interconnects are desirable to connect smaller chip packages and components to each other and to other carriers, PCBs, and the like. Taller interconnects are desirable for maintaining regular manufacturing processes (such as reflow and underfill processes), as well as to improve solder joint reliability. Further, taller interconnects are also desirable for coupling packages on packages, chips to chips, and other stacked system arrangements.

Some solutions have been advanced to achieve taller interconnects, with some of the solutions having a fine pitch. For example, copper pillars with a desired height may be coupled to silicon chips. Providing the copper pillars can involve plating a silicon surface repeatedly to achieve the desired height. However, this can be an expensive process, and can often take about 4 hours to plate a 40-50 um pillar on a silicon die. In another example, copper-to-copper bonding can also be used to obtain a fine pitch interconnect for chip to chip coupling. However, a very high level of chip to chip co-planarity (which can be difficult and/or expensive to achieve) is needed for a successful and lasting bond.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1A:
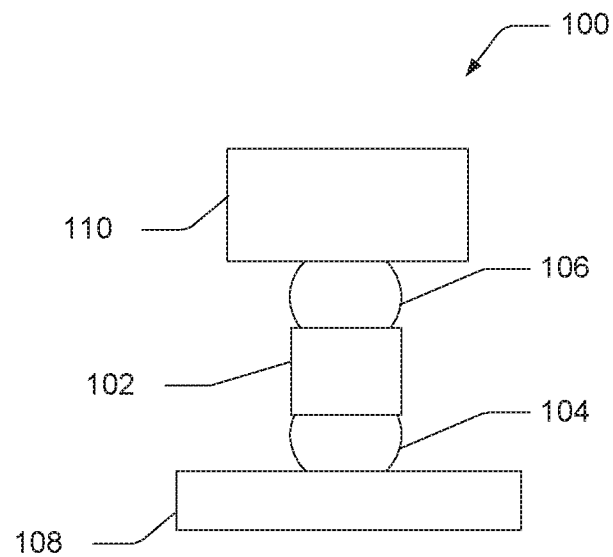
FIG. 1A shows a plan view of an example multi-layer interconnect arrangement, according to an implementation.

Representative implementations of devices and techniques provide multi-layer interconnect structures for coupling various carriers, printed circuit board (PCB) components, integrated circuit (IC) dice, and the like (i.e., microelectronic elements). In various implementations, the interconnections comprise tall and/or fine pitch physical connections. In the implementations, multiple layers of conductive structures or materials are arranged to form the multi-layer interconnect structures ("interconnects").

In the implementations, the multi-layer interconnects are arranged to include a stack of conductive structures or layers. For example, the stack of conductive structures or layers includes two or more structures or layers of conductive material arranged such that the structures or layers are positioned one above another, in a stacked arrangement or an overlapping arrangement. Different conductive structures or layers of the stack that make up a multi-layer interconnect may have different properties. For example, the different layers may have different melting points. Accordingly, at a given temperature, one or more of the conductive structures or layers may melt (i.e., a reflowable structure or layer) and one or more of the conductive structures or layers may remain in a solid form (i.e., a non-reflowable structure or layer).

In various implementations, the conductive structures (e.g., layers) of an interconnect may be comprised of differing materials or different combinations of materials. For example, in an implementation, one or more structures or layers may be constructed of one material (e.g., copper, for instance) or combination, and one or more other structures or layers may be constructed of another material (e.g., solder, for instance, or a solder-copper composite, or solder-nickel, etc.) or combination. In various implementations, the layers or structures of an interconnect may be comprised of various other materials or combinations.

In an implementation, nonwettable layers or barriers may be used with one or more of the structures or layers to assist in forming a shape of the structures or layers, including a pitch of the structures or layers. For example, the nonwettable layers or barriers may be used to control, contain, direct, or otherwise form the structures or layers.

In various implementations, the techniques and components described herein may also be arranged to improve mechanical and/or thermal performance of the interconnects, as well as improving manufacturing processes. Additionally, increasing the interconnect height (while maintaining small pitch) can improve bump reliability, can facilitate the dispensing of underfill, and can allow regular reflow bonding, making it easier on some dielectrics, and so forth.

Various implementations and arrangements are discussed with reference to electrical and electronics components and varied carriers. While specific components (i.e., printed circuit boards (PCB), integrated circuit (IC) chip dice, etc.) are mentioned, this is not intended to be limiting, and is for ease of discussion and illustrative convenience. The techniques and devices discussed with reference to a PCB, chip die, or the like, are applicable to any type or number of electrical components (e.g., sensors, transistors, diodes, etc.), circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic element."

Implementations are explained in more detail below using a plurality of examples. Although various implementations and examples are discussed here and below, further implementations and examples may be possible by combining the features and elements of individual implementations and examples.

Example Multi-Layer Interconnect Arrangements

FIG. 1 shows plan views of two example multi-layer interconnect arrangements ("interconnects") 100, according to example implementations. FIGS. 2-9 show plan views of various and alternate processes of forming multi-layer interconnects 100, including various implementations of multi-layer interconnects 100. The techniques, components, and devices described herein with respect to the multi-layer interconnects 100 are not limited to the illustrations in FIGS. 1-9, and may be applied to other designs, types, arrangements, and constructions including with other electrical components without departing from the scope of the disclosure.

Figure 9:
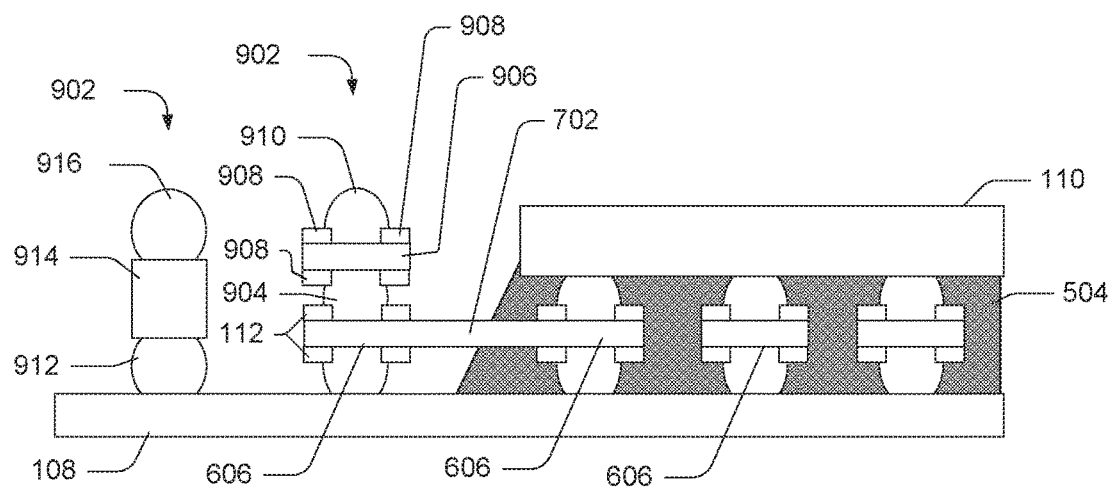
FIG. 9 shows an example structure formed using a number of additional multi-layer interconnects, according to an embodiment.
Figure 10:
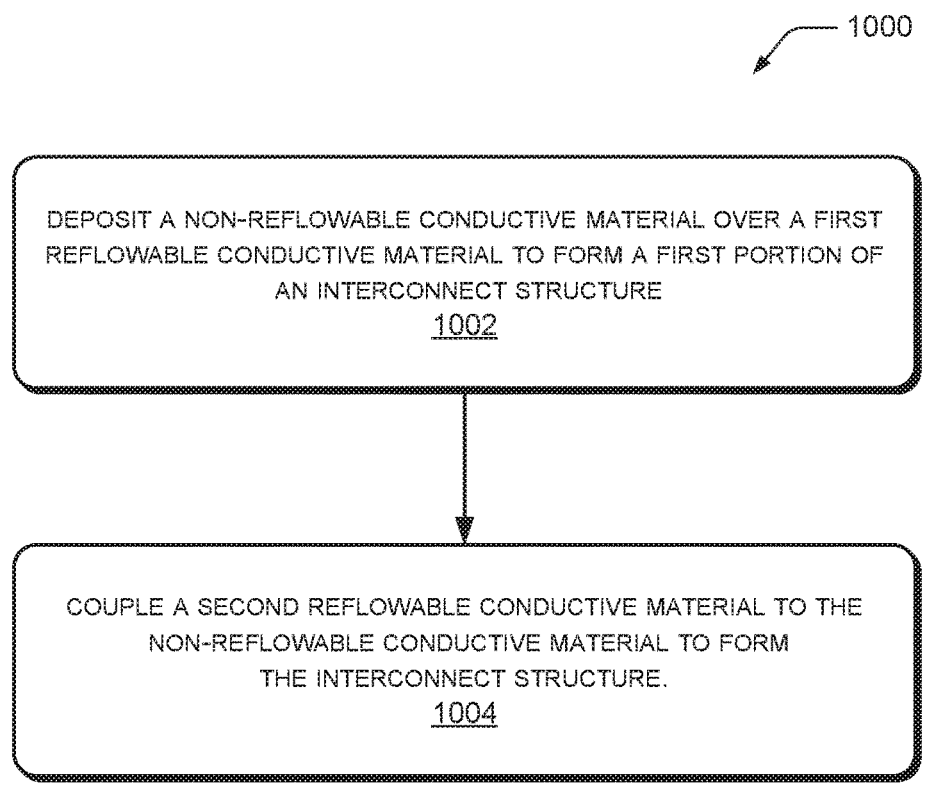
FIG. 10 is a flow diagram illustrating an example process for forming a multi-layer interconnect, according to an implementation.

FIG. 10 is a flow diagram illustrating one example process for forming a multi-layer interconnect 100, according to an implementation. The use of the text-based flow diagram of FIG. 10 to illustrate the process described is one example that is not intended to be limiting. Further, FIGS. 2-9 and their respective discussions also illustrate example processes for forming a multi-layer interconnect 100, in the form of a graphics-based flow diagram. Each of the processes described with respect to FIGS. 1-10 also describe a corresponding apparatus, structure, system, or the like, including one or more multi-layer interconnects 100.

Unless otherwise specified, alternative components to those specifically mentioned may be used to implement the techniques described herein. In various implementations, a multi-layer interconnect 100 may be a stand-alone unit, or it may be a portion of a system, component, structure, or the like. For example, the techniques described herein may be applied to groups of multiple multi-layer interconnects 100 as formed on a die, a wafer, a package, or other component.

Referring to FIG. 1A, the drawing shows a first example of a multi-layer interconnect structure 100 including a conductive structure 102 (e.g., a non-reflowable conductive material structure or layer) disposed over a first reflowable conductive material 104, and a second reflowable conductive material 106 coupled to the conductive structure 102 on a side opposite the first reflowable conductive material 104, to form the multi-layer interconnect structure 100. In the example, the multi-layer interconnect 100 electrically and mechanically couples a first microelectronic element 108 (sometimes referred to as a printed circuit board (PCB), for ease of discussion, but may refer to any carrier, die, package, wafer, interposer, panel, or other first microelectronic element) to a second microelectronic element 110 (sometimes referred to as an integrated circuit (IC) die, for ease of discussion, but may refer to any carrier, PCB, package, wafer, panel, or other second microelectronic element).

The conductive structure 102 forms a non-reflowable separation element between the first reflowable conductive material 104 component and the second reflowable conductive material 106 component. In various implementations, the conductive structure 102 comprises a metallic sheet, foil, conductive deposit, plating, wirebond trace, or the like. In an implementation, the conductive structure 102 is formed by patterning a conductive material layer (see FIG. 2, for instance). In one implementation, the conductive structure 102 does not comprise a metallic post formed using through-mask methods.

For example, in the implementations, the conductive structure 102 may have a thickness (i.e., height) of between 0.5 and 500 um. In alternate implementations, the conductive structure 102 may be thicker than 500 um. In an embodiment, the conductive structure 102 has a height that is at least 15% greater than a height of the first reflowable material component 104 and/or the second reflowable material component 106.

In some implementations, where one goal is to increase a height of the multi-layer interconnect 100, the thickness of the conductive structure 102 may be sized to achieve the desired interconnect 100 height. In such implementations, the thickness of the conductive structure 102 may be sized to take into account the predicted or predetermined thicknesses of the first (104) and second (106) reflowable layers, component 110 and component 108, to achieve the desired interconnect 100 height. In some examples, the desired interconnect 100 height may be approximately 50 um, or a similar height. In other examples, the desired interconnect 100 height may be greater or lesser than 50 um.

In various implementations, the conductive structure 102 is comprised of copper, a copper composite, or another metal (e.g., gold, titanium, silver, nickel, aluminum, tungsten, etc.), a composite of the other metals, a polymer embedded with metallic ions, a conductive ceramic, or any other conductive material that is a solid at common reflow temperatures (e.g., approximately 200 degrees C.).

In an implementation, the conductive structure 102 includes one or more diffusion barrier layers (not shown) applied to one or both sides of the conductive structure 102. For example, the diffusion barrier layer(s) may include a thin metallic film, and may prevent or reduce the diffusion of the material of the conductive structure 102 into the coupled reflowable layers (104 and/or 106). In the implementation, the diffusion barrier layer comprises a substantially inert material with respect to the conductive structure 102 and the first (104) and/or second (106) reflowable layers while maintaining conductivity. Examples of possible diffusion barrier layer materials include titanium or nickel, chromium, tantalum, tungsten, or the like.

In further implementations, a precious metal layer such as a gold layer, or the like, may be additionally or alternately applied to one or both sides of the conductive structure 102 (either with or without a diffusion barrier layer). In one embodiment the structure 102 comprises significantly of a barrier material.

In various implementations, the reflowable conductive material at the first (104) and/or second (106) reflowable layers comprises a solder or a solder-composite material, or a low temperature melting material or alloy. For example, in the implementations, the first (104) and/or second (106) reflowable layers comprise a tin-based solder material, a tin-copper composite solder material, a tin-lead eutectic, or the like. In the implementations, the first (104) and/or second (106) reflowable layers are comprised of a material that melts at a lower temperature than the conductive structure 102. For example, the melting point of the first (104) and/or second (106) reflowable layers may be at least 10 to 30 degrees lower than the melting point of the conductive structure 102. In various examples, the first (104) and second (106) reflowable layers may be identical, similar, or different reflowable materials.

Figure 1B:
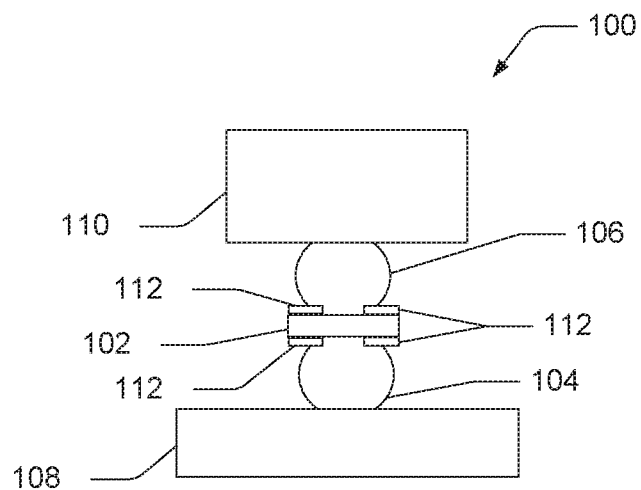
FIG. 1B shows a plan view of another example multi-layer interconnect arrangement, according to another implementation having one or more nonwettable barriers.

Referring to FIG. 1B, the drawing shows a second example of a multi-layer interconnect structure 100, according to another implementation. The second example of a multi-layer interconnect structure 100 shown at FIG. 1B is similar to the first example of a multi-layer interconnect structure 100 shown at FIG. 1A, and includes one or more nonwettable barriers 112 disposed at the conductive structure 102. In various implementations, the one or more nonwettable barriers 112 form a barrier against the flow of liquid material. In other words, the one or more nonwettable barriers 112 prevent liquid material from flowing beyond the boundary of the barrier(s) 112.

In an implementation, one or more nonwettable barriers 112 are formed on one or both surfaces of the conductive structure 102, as shown in FIG. 1B. In the implementation, reflowable conductive material (such as the first (104) and/or second (106) reflowable layers, for instance) may be deposited on the conductive structure 102 in proximity of the one or more nonwettable barriers 112. In various examples, the one or more nonwettable barriers 112 prevent the reflowable conductive material (or other material) from flowing beyond the boundary of the nonwettable barriers 112 when in a liquid or semi-liquid form. In this way, the shape, size, form, or other physical limits of the reflowable conductive material (or other material) can be controlled as desired. For instance, a pitch of the first (104) and/or second (106) reflowable layers may be controlled using the one or more nonwettable barriers 112.

In various implementations, the nonwettable barrier(s) 112 comprise a material that prevents the flow of liquid solder or solder-composite materials beyond a boundary of the barrier(s) 112. In one example, the nonwettable barrier(s) 112 comprise a polymer or poly imide material. In alternate implementations, the nonwettable barrier(s) 112 comprise any other nonwettable material e.g., such as organic materials, a dielectric, a resist material, a polymeric layer, inorganic materials such as silicon oxide, silicon nitride, silicon carbide, SiON, SiOC, or conducting materials such as metals, metallic alloys or compound in the form of oxides or nitrides or ceramic materials, including glass-ceramic films, and the like.

In an implementation, a nonwettable material layer may be patterned to form the nonwettable barrier(s) 112. In various examples, the nonwettable barrier(s) 112 may have various forms or shapes when patterned or deposited. In one example, the nonwettable barrier(s) 112 have closed geometric shapes with open interiors (e.g., circles, ellipses, polygons, etc.). In another example, the nonwettable barrier(s) 112 have partly-closed predefined shapes with open interiors (e.g., curved or angled barriers in predefined arrangements, etc.). In these examples and others, the open interiors form an area with predefined boundaries for depositing conductive reflowable materials, such as solder or solder composites, for instance.

In an implementation, a microelectronic assembly incorporating the multi-layer interconnect structure 100, as shown in FIG. 1B, may be formed by the following process: providing a first microelectronic element (such as microelectronic element 108, for example) having a first reflowable material component (such as first reflowable material component 104, for example) formed on a surface of the first microelectronic element, and having a non-reflowable material component (such as non-reflowable material component 102, for example) formed on the first reflowable material component; providing a second microelectronic element (such as microelectronic element 110, for example) having a second reflowable material component (such as second reflowable material component 106, for example) formed on a surface of the second microelectronic element; and electrically coupling the first microelectronic element to the second microelectronic element by coupling the second reflowable material component to the non-reflowable material component.

In an implementation, the process includes coupling the second reflowable material component to the non-reflowable material component via a heated reflow process. In an embodiment, at least one of the first and second reflowable material components comprises a solder or a solder-composite material and the non-reflowable material component comprises a metallic structure, as described above.

In one example, the non-reflowable material component includes a patterned layer that is nonwettable with respect to a material of at least one of the first and the second reflowable material components. Further, at least one of the first and second microelectronic elements is taken from the group comprising: an integrated chip (IC) die, a printed circuit board (PCB), a semiconductor wafer, a semiconductor package, a silicon-based carrier, a glass carrier, and a ceramic carrier.

Figure 2:
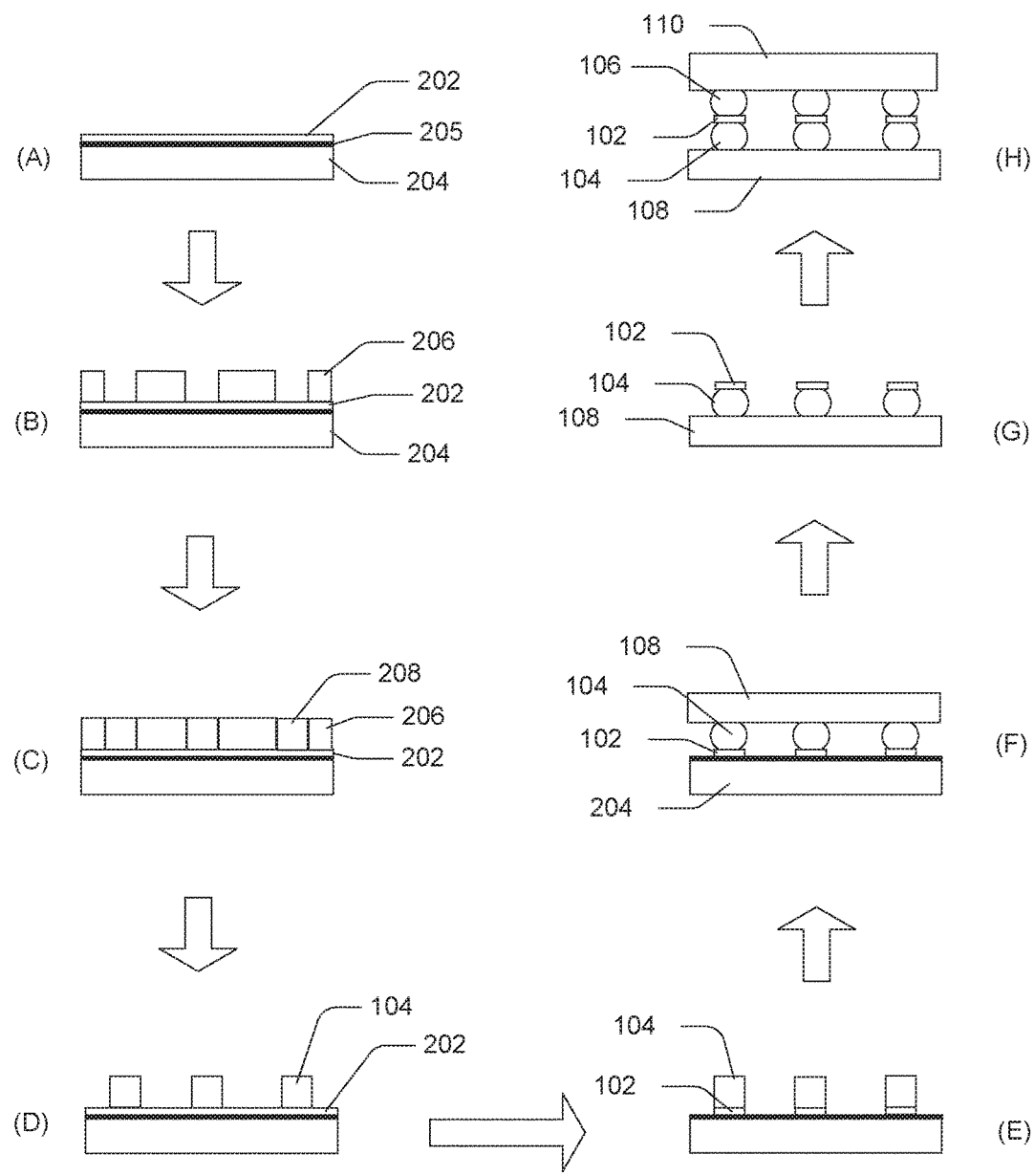
FIG. 2 shows an example process for forming a multi-layer interconnect, according to an embodiment.

FIG. 2 shows an example process for forming one or more multi-layer interconnects 100, according to one embodiment. At "A," the process includes applying a conductive layer or layers 202 (as described above) to a carrier 204. For example, the conductive layer 202 may be a multi-layered structure. In one example, other conductive materials like Ti, Ni, Au, etc. are deposited on the base conductive layer 202, which may be comprised of Cu, Al, etc., or combinations/layers of the same.

In an example, the carrier 204 is a temporary carrier. In other examples, the carrier 204 is a permanent carrier (such as a wafer, panel, or the like, for instance), and remains as part of the final structure. In an implementation, the process includes coupling the conductive layer 202 to the carrier 204 using a temporary adhesive 205, or the like. In various examples, the carrier 204 may comprise a carrier of silicon, glass, ceramic, a printed circuit board (PCB), thick copper foil, or the like.

At "B," the process includes applying a resist layer 206 to the conductive layer 202 and patterning the resist layer 206.

At "C," the process includes depositing a reflowable conductive material 208 on the conductive layer 202, between portions of the patterned resist layer 206. In an implementation, the process includes screen printing the reflowable conductive material 208 onto the conductive layer 202. At "D," the process includes removing the resist layer 206 to reveal patterned interconnect structures 104 comprising the reflowable conductive material 208. Further, the process may also include cleaning the assembly.

At "E," the process includes etching the conductive layer 202 to remove unwanted portions of the conductive layer 202 to form a patterned conductive structure 102 (as described above), such that at least portions of the conductive layer 202 covered by the interconnect structures 104 are not removed. For example, the etching may include anisotropic etching, or the like. In an implementation, the process includes etching the conductive layer 202 and the reflowable conductive material 208 during a same process. Of course, the conductive layer 202 could be patterned prior to the process of forming the reflowable conductive material 208 thereupon. In other embodiments, the conductive layer 202 may be coated with a flowable material on both its major surfaces prior to attaching to the adhesive layer 205. In the etching step, the flowable layer 106, the conductive layer 202 and the flowable layer 104 may be patterned and etched in one or more operations.

At "F," the process includes mounting a printed circuit board (PCB) carrier 108 (may include any carrier, die, package, wafer, panel, or other microelectronic element, as discussed above) to the interconnect structures 104. In an implementation, the process includes coupling the PCB carrier 108 to the interconnect structures 104 via heated reflow. At "G," the process includes removing the carrier 204 (when a temporary carrier 204 is used). For example, removing the carrier 204 includes removing the temporary adhesive 205 (e.g., by peeling it away, etc.). Alternately, the carrier 204 may comprise a permanent element, such as a wafer, panel, or the like.

At "H," the process includes mounting an integrated circuit (IC) die 110 with interconnect structures 106 (e.g. a "bumped" die or package, wafer, panel, or other microelectronic element, as discussed above) onto the patterned conductive structure 102, on a side previously occupied by the temporary carrier 204. For example, the interconnect structures 106 of the IC die 110 may comprise solder bumps, or the like. In various implementations, many or all of the bumps of the IC die 110 match up to the conductive structures 102. In an implementation, the process includes coupling the IC die 110 to the patterned conductive structure 102 via heated reflow.

In an alternate implementation, the interconnect structures 106 may be formed (e.g., deposited, printed, etc.) with the patterned interconnect structures 104 and the patterned conductive structure 102, as described at "E." In the implementation, the interconnect structures 106 may be formed atop the patterned conductive structure 102, or the interconnect structures 106 may be formed along with the patterned conductive structure 102 during etching of the patterned conductive structure 102. In an implementation, the IC die 110 (or a carrier, PCB, package, wafer, interposer, panel, or other microelectronic element, as described above) may be attached to the interconnect structures 106, and coupled via heated reflow, for example.

Figure 3:
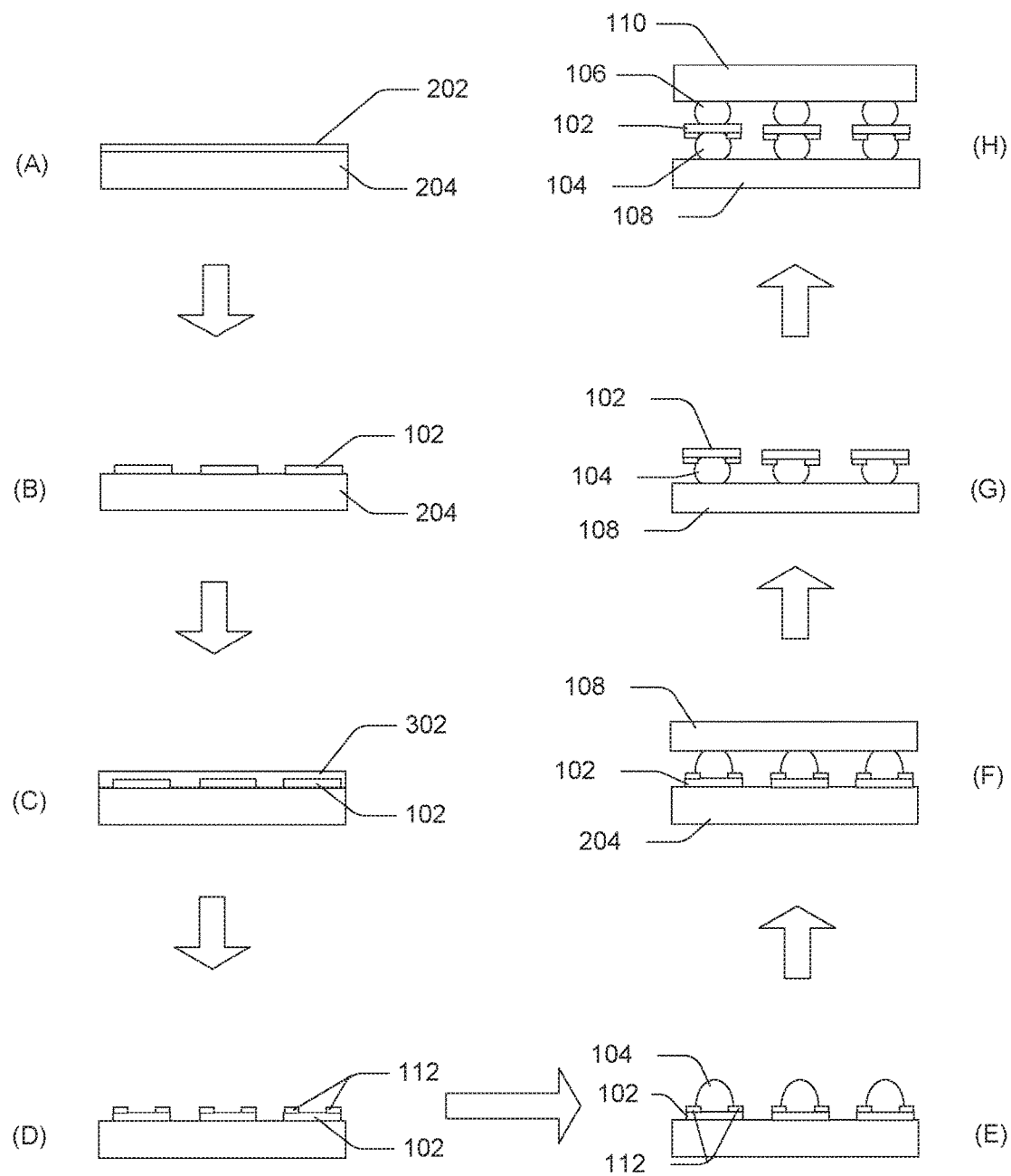
FIG. 3 shows an example process for forming a multi-layer interconnect, including one or more nonwettable barriers, according to another embodiment.

FIG. 3 shows an example process for forming one or more multi-layer interconnects 100, including one or more non-wettable barriers 112, according to another embodiment. In various implementations, the process described with reference to FIG. 3 is similar to the process described with reference to FIG. 2, except as noted. At "A," the process includes applying a conductive layer 202 to a temporary carrier 204. At "B," the process includes patterning the conductive layer 202 to form a patterned conductive structure 102.

At "C," the process includes applying a nonwettable layer 302 to the patterned conductive structure 102. At "D," the process includes patterning the nonwettable layer 302 to form one or more nonwettable barriers 112 on the patterned conductive structure 102. In an implementation, the process includes patterning the nonwettable layer 302 by removing the nonwettable layer 302 from the patterned conductive structure 102, except at one or more edges of the patterned conductive structure 102. In one implementation, portions of the nonwettable layer 302 at each of the edges of the conductive structure 102 are retained, and the rest is removed.

In one implementation, the process includes forming nonwettable barriers 112 having closed geometric shapes with open interiors on the patterned conductive structure 102. In another implementation, the process includes forming nonwettable barriers 112 having partly-closed predefined shapes with open interiors on the patterned conductive structure 102. In alternate implementations, the process included forming nonwettable barriers 112 having other shapes or forms.

At "E," the process includes depositing a reflowable conductive material on the patterned conductive structure 102, between the nonwettable barriers 112, to form interconnect structures 104. For example, the process may include "bumping" the patterned conductive structure 102. At "F," the process includes mounting a printed circuit board (PCB) carrier 108 to the interconnect structures 104. At "G," the process includes removing the temporary carrier 204. At "H," the process includes mounting an integrated circuit (IC) die 110 with interconnect structures 106 onto the patterned conductive structure 102, on a side previously occupied by the temporary carrier 204. In an implementation, the process includes coupling the IC die 110 to the patterned conductive structure 102 via heated reflow.

Figure 4:
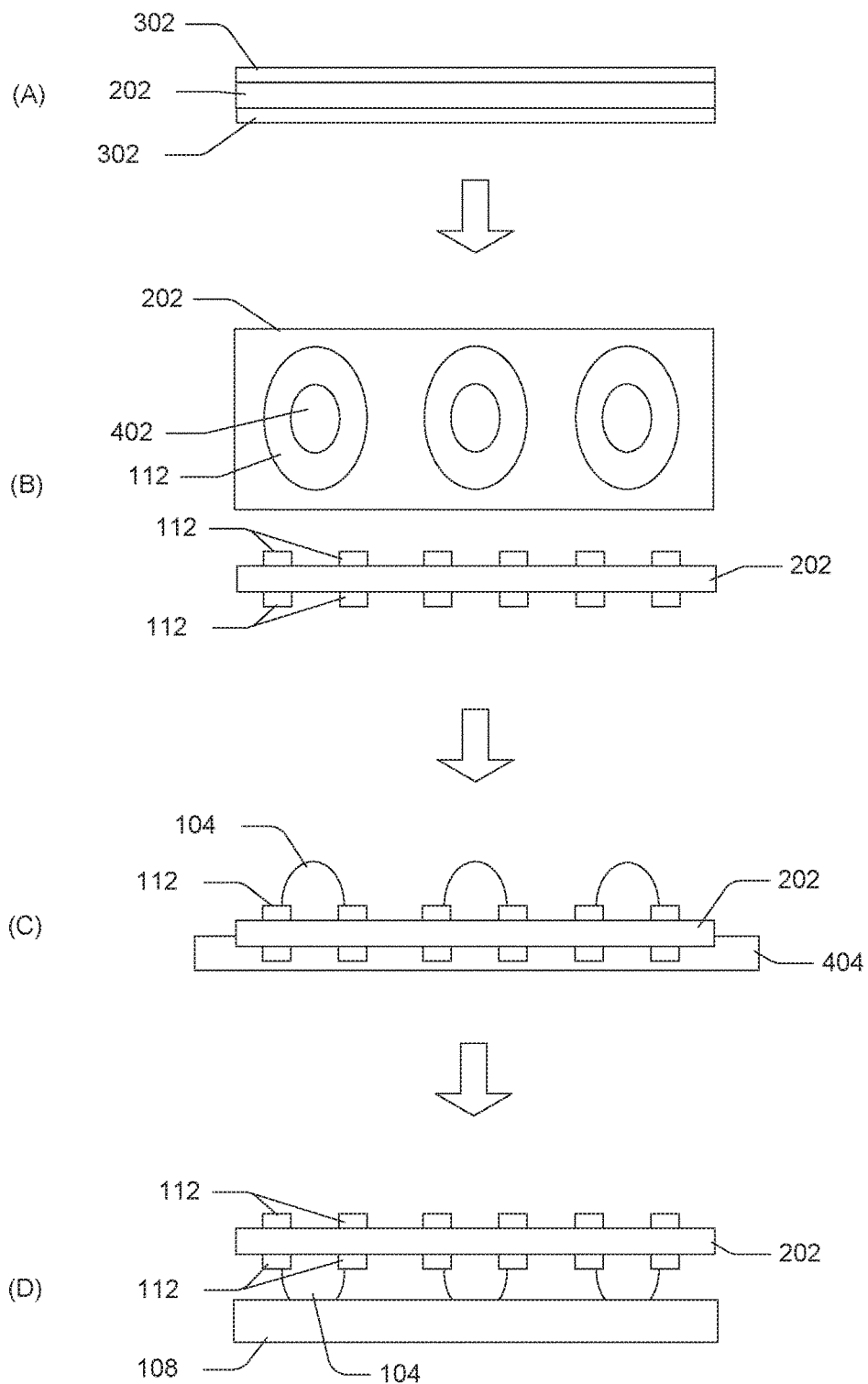
FIG. 4 shows an example process for forming a multi-layer interconnect, including one or more nonwettable barriers, according to another embodiment.

FIG. 4 shows an example process for forming one or more multi-layer interconnects 100, including one or more nonwettable barriers 112, according to another embodiment. At "A," the process includes applying a nonwettable layer 302 to a first side and a second side of a conductive layer 202. At "B," the process includes patterning the nonwettable layer 302 to form nonwettable barriers 112 with open interiors 402 on the first side and the second side of the conductive layer 202. This is illustrated at "B" with a plan view and a profile view of the conductive layer 202 with nonwettable barriers 112. In one example, as shown, the nonwettable barriers 112 on the first side and/or the second side of the conductive layer 202 are substantially elliptically shaped with open interiors 402. As described above, in other examples, the nonwettable barriers 112 have other open or closed shapes, and may form open interiors 402.

At "C," the process includes depositing a reflowable conductive material within the open interiors 402 of the nonwettable barriers 112 of the first side of the conductive layer 202 to form interconnect structures 104. In an implementation, as illustrated at "C," the process includes supporting the conductive layer 202 with a support layer 404 while depositing the reflowable conductive material within the nonwettable barriers 112 on the conductive layer 202.

At "D," the process includes removing the support layer 404 and mounting a printed circuit board (PCB) carrier 108

(or PCB, die, package, wafer, panel, or other microelectronic element, as discussed above) to the interconnect structures 104. In various implementations, the process includes coupling the PCB carrier 108 to the interconnect structures 104 by heated reflow. As mentioned above, in this and all described processes herein, the reflowable material layers are melted during the heated reflow, while the non-reflowable material layers (such as the conductive layer 202 or the conductive structures 102, for example) remain in a solid form during the heated reflow.

Figure 5:
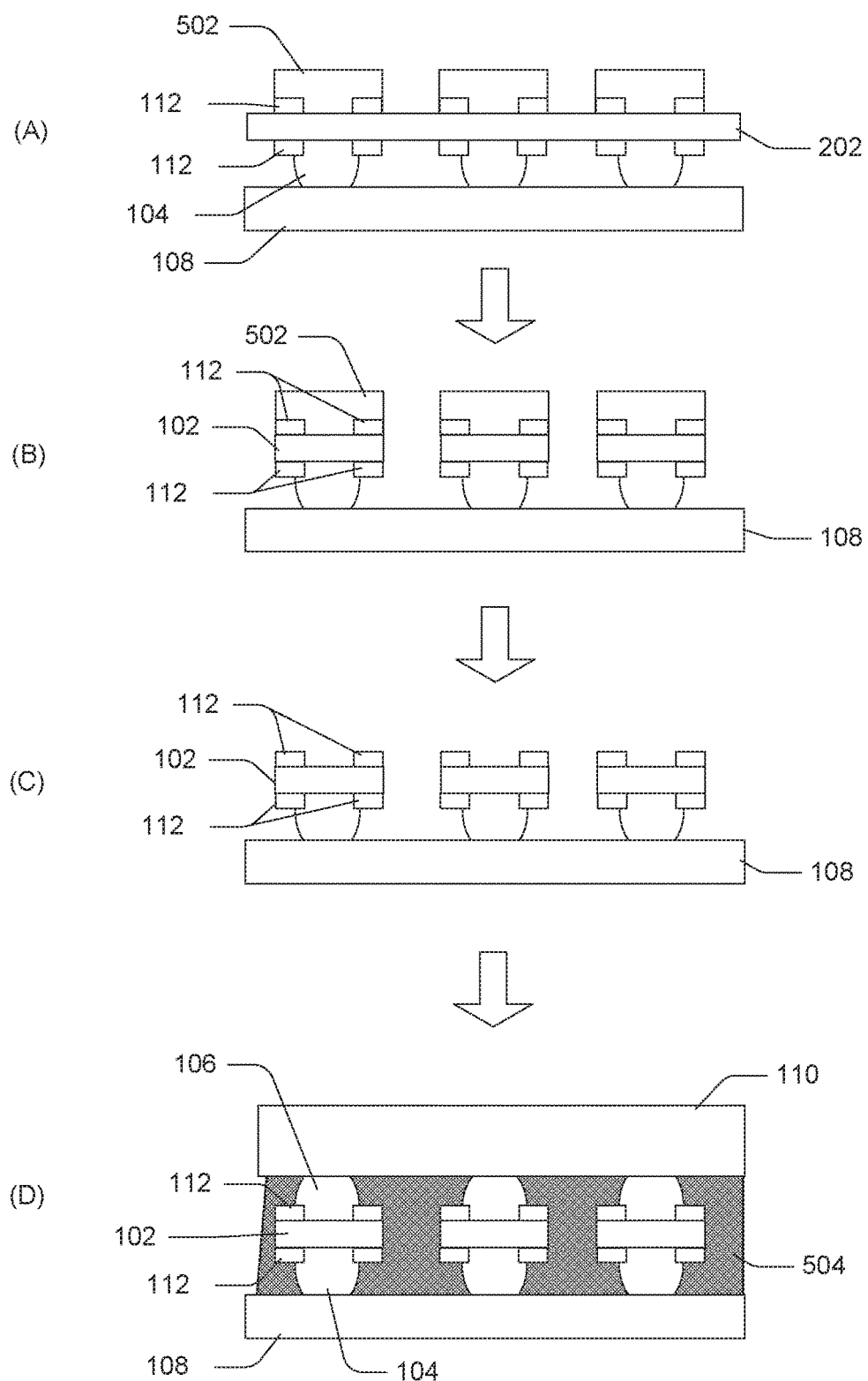
FIG. 5 shows an example process for forming a multi-layer interconnect, which builds off of the process of FIG. 4, according to another embodiment.

FIG. 5 shows a continuation of the example process of FIG. 4 for forming one or more multi-layer interconnects 100. At "A," the process includes applying a patterned resist mask 502 to the second side of the conductive layer 202, including over the nonwettable barriers 112 of the second side of the conductive layer 202. At "B," the process includes patterning the conductive layer 202 to form one or more patterned conductive structures 102, based on the patterned resist mask 502. In an alternate implementation, patterning the conductive layer 202 to form the conductive structures 102, including the use of the resist mask 502 can be performed prior to mounting the printed circuit board (PCB) carrier 108 to the interconnect structures 104.

At "C," the process includes removing the patterned resist mask 502, and at "D," the process includes mounting an integrated circuit (IC) die 110 (or another PCB or die, package, wafer, panel, or other microelectronic element, as discussed above) with interconnect structures 106 onto the patterned conductive structure 102, such that the interconnect structures 106 of the IC die 110 are located within the open interiors 402 of the nonwettable barriers 112 of the second side of the conductive layer 202.

In an implementation, the process includes underfilling (at 504) between the IC die 110 and the PCB carrier 108, as shown at "D." For example, the process includes underfilling around the patterned conductive structure 102, the interconnect structures 104 and 106, and/or the nonwettable barriers 112. In an alternate implementation, the underfilling is optional.

Figure 6:
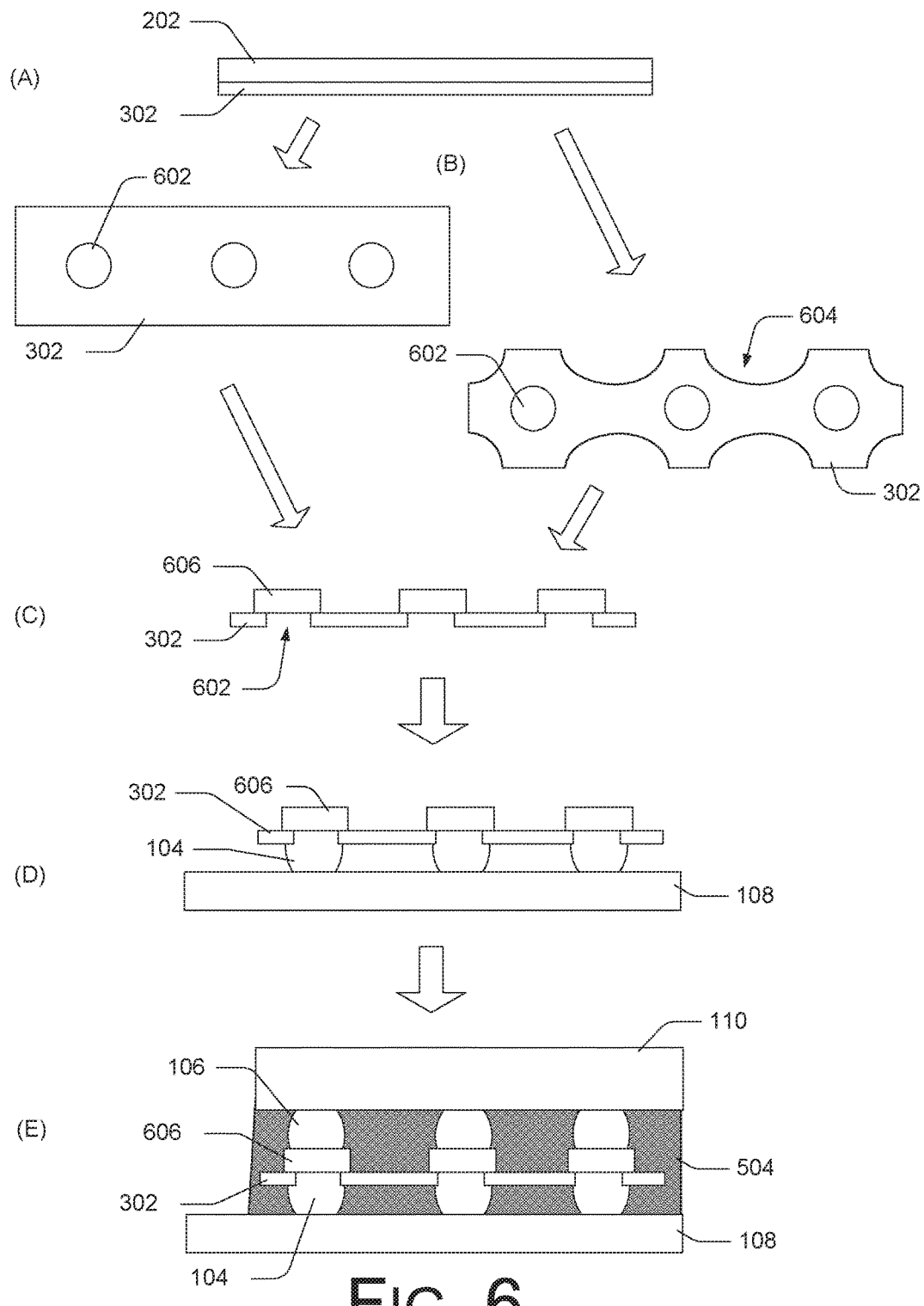
FIG. 6 shows an example process for forming a multi-layer interconnect, including one or more nonwettable layers forming barriers, according to another embodiment.

FIG. 6 shows an example process for forming one or more multi-layer interconnects 100, including one or more nonwettable layers forming barriers 112, according to another embodiment. In the example of FIG. 6, the conductive structure 102 (as shown at FIG. 1B, for example) is embodied in one or more conductive pads 606. Additionally, the nonwettable barriers 112 (as shown at FIG. 1B, for example) is embodied in a patterned nonwettable layer 302 (e.g., with patterned openings 602 in the nonwettable layer 302 forming nonwettable barriers to reflowable material).

At "A," the process includes applying a nonwettable layer 302 to at least a first side of a conductive structure or layer 202. At "B," the process includes patterning the nonwettable layer 302 to form openings 602 in the nonwettable layer 302. FIG. 6 shows two examples of the nonwettable layer 302 at "B." In one implementation as shown (the example on the right), the process at "B" includes removing additional portions 604 of the nonwettable layer 302, to provide additional electrical interconnections or the like. In alternate examples, the nonwettable layer 302 may include other shapes or forms to accommodate interconnections, access to pads or terminals, or the like.

At "C," the process includes patterning the conductive structure 202 to form conductive pads 606 covering the openings 602 in the nonwettable layer 302. This is illustrated with the profile view at "C." At "D," the process includes depositing a reflowable conductive material onto the conductive pads 606 and within the openings 602 in the nonwettable layer 302, to form a first set of interconnect structures 104. Further, at "D," the process includes mounting a printed circuit board (PCB) carrier 108 (or die, package, wafer, panel, or other microelectronic element, as discussed above) to the first interconnect structures 104.

At "E," the process includes mounting an integrated circuit (IC) die 110 (or another PCB, die, package, wafer, panel, or other microelectronic element, as discussed above) with second interconnect structures 106 onto the conductive pads 606, such that the second interconnect structures 106 of the IC die 110 are located on the conductive pads 606 on a side opposite of the first interconnect structures 104. In an implementation, the process includes underfilling (at 504) between the IC die 110 and the PCB carrier 108, as shown at "E."

In an implementation of the process, the nonwettable layer 302 holds the conductive pads 606 in a desired physical arrangement during processing, including during depositing the reflowable conductive material, mounting the PCB carrier 108, and/or mounting the IC die 110. In other words, the nonwettable layer 302 is a structural member that holds portions of the assembly (e.g., including the conductive pads 606) in place and at relative positions with respect to each other during processing.

Figure 7:
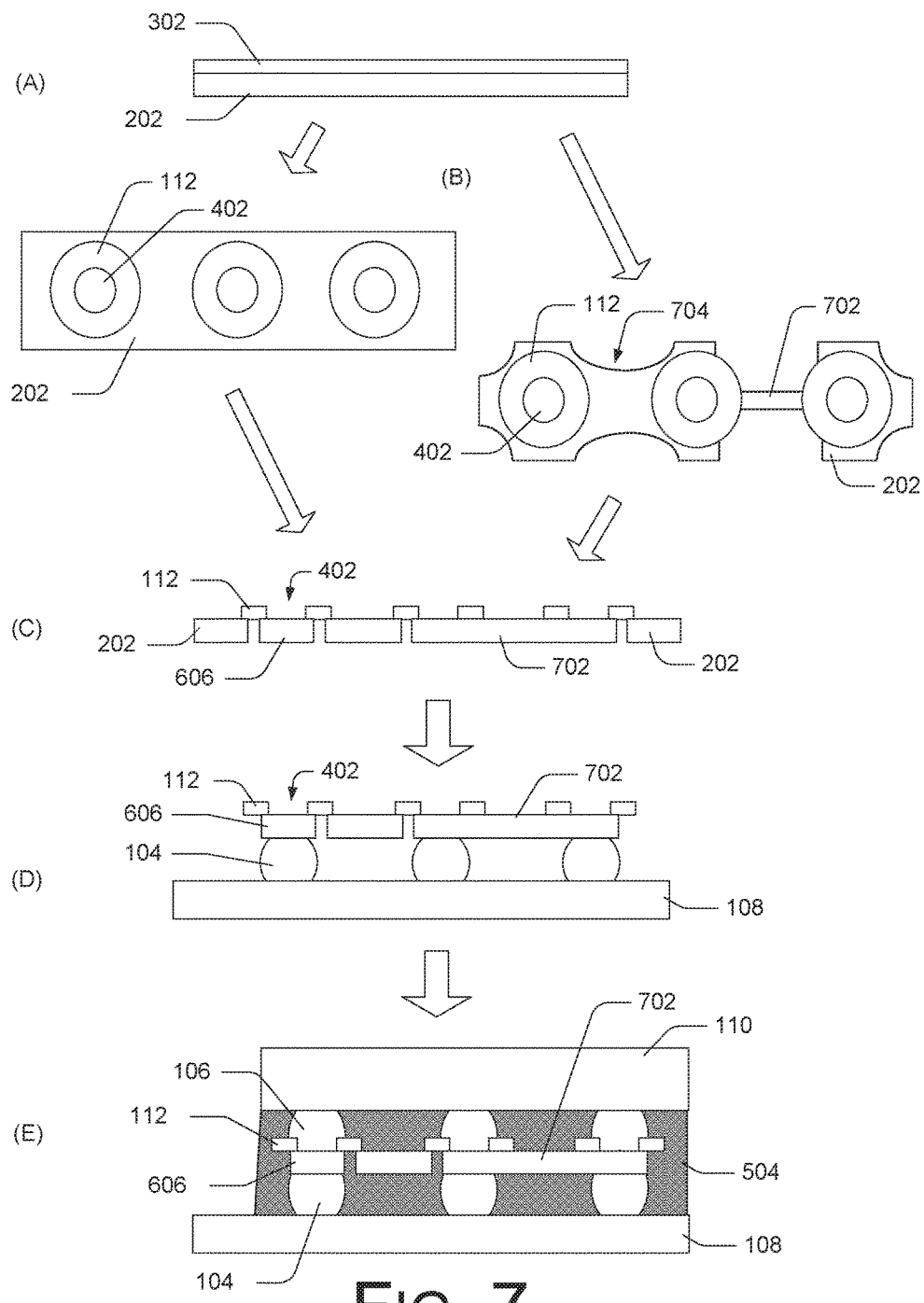
FIG. 7 shows an example process for forming a multi-layer interconnect, including one or more conductive structures and one or more conductive traces, according to another embodiment.

FIG. 7 shows an example process for forming one or more multi-layer interconnects 100, including one or more conductive structures 102 and one or more conductive traces 702, according to another embodiment. In the example of FIG. 7, the conductive structures 102 (as shown at FIG. 1B, for example) are embodied in one or more conductive pads 606. At "A," the process includes applying a nonwettable layer 302 to at least a first side of a conductive structure or layer or layers 202.

At "B," the process includes patterning the nonwettable layer 302 to form nonwettable barriers 112 with open interiors 402 on at least the first side of the conductive layer 202. FIG. 7 shows two examples of the conductive layer 202 at "B." In an implementation, the process includes patterning the conductive layer 202 to form conductive pads 606 covering the open interiors 402 of the nonwettable barriers 112 (e.g., illustrated with the profile view at "C"). In one implementation as shown (the example on the right), the process at "B" includes patterning the conductive layer 202 to form conductive traces 702 electrically coupling two or more of the conductive pads 606. In an alternate implementation, the process includes removing additional portions 704 of the conductive layer 202, to provide additional access to interconnections, or the like.

At "D," the process includes depositing a reflowable conductive material on the conductive layer 202 within the open interiors 402 of the nonwettable barriers 112 to form interconnect structures 104. In an implementation, the process includes depositing or attaching the reflowable conductive material onto the conductive pads 606 within the open interiors 402 of the nonwettable barriers 112 to form the interconnect structures 104.

At "D," the process also includes mounting a printed circuit board (PCB) carrier 108 (or other die, wafer, or panel, etc.) to the interconnect structures 104. At "E," the process includes mounting an integrated circuit (IC) die 110, package, or other active or passive microelectronic element with interconnect structures 106 onto the conductive structure (i.e., the conductive pads 606), such that the interconnect structures 106 of the IC die 110 are located within the open interiors 402 of the nonwettable barriers 112. Additionally, as an option, the process includes underfilling (shown at 504) between the IC die 110 and the PCB carrier 108.

In an implementation, a combination of the nonwettable barriers 112 and the conductive structures (e.g., the conductive layer 202 and/or the conductive traces 702) holds the conductive pads 606 in a desired physical arrangement during processing, including during depositing the reflowable conductive material, mounting the PCB carrier 108, and/or mounting the IC die 110. In various examples, the conductive traces 702 also provide an additional routing layer between the conductive pads 606, which is not the part of the top (110) or bottom (108) substrate (i.e., PCB, die, package, wafer, panel, or other microelectronic element, as discussed above).

Figure 8:
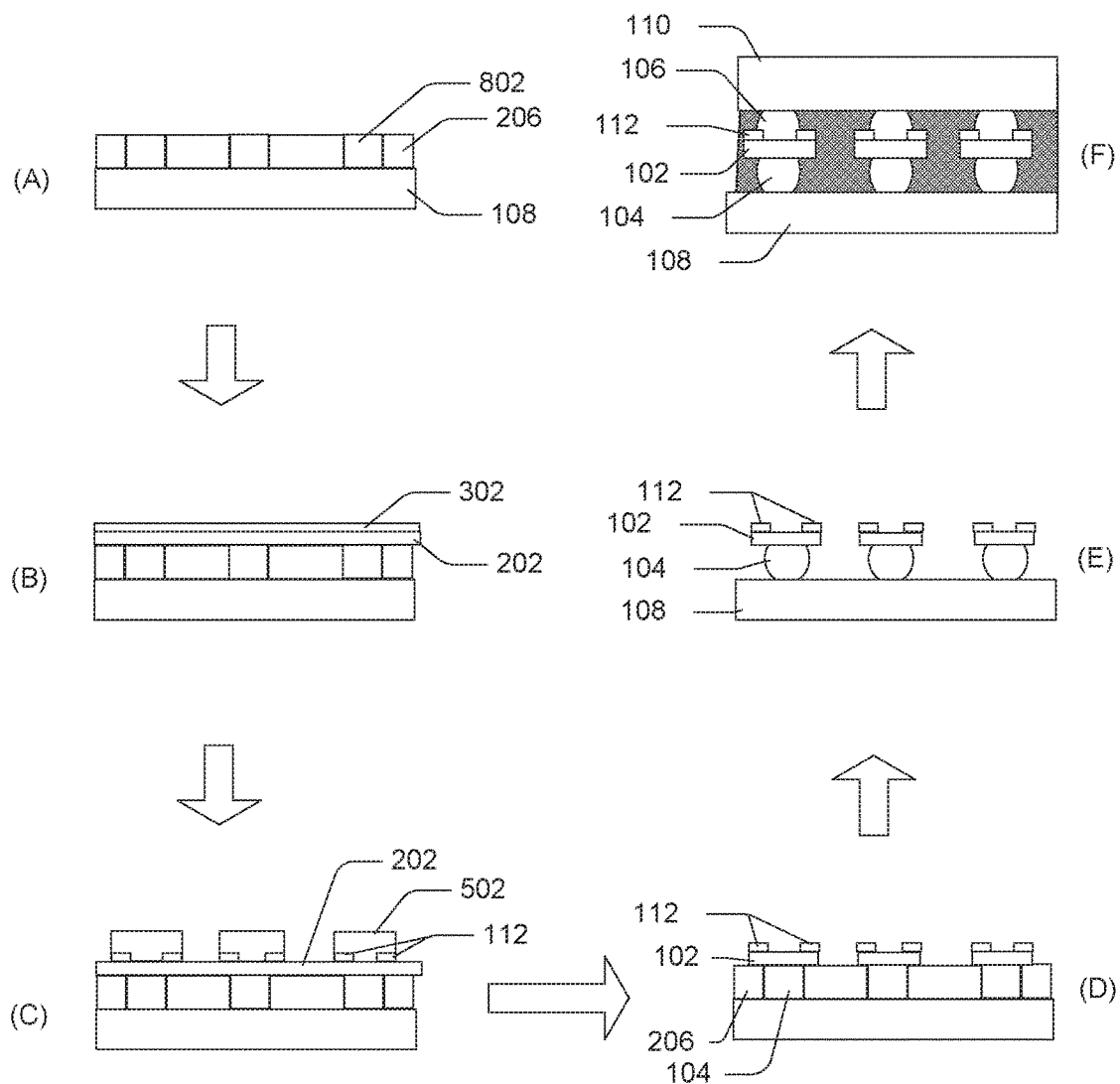
FIG. 8 shows an example process for forming a multi-layer interconnect, including depositing a reflowable conductive pattern, according to another embodiment.

FIG. 8 shows an example process for forming one or more multi-layer interconnects 100, including depositing a reflowable conductive pattern, according to another embodiment. At "A," the process includes depositing patterned reflowable conductive material 802 on a printed circuit board (PCB) carrier 108 (or die, package, wafer, panel, or other microelectronic element, as discussed above). In an example, the reflowable conductive material 802 is printed on the PCB carrier 108. At "A," the process also includes applying a resist layer 206 to the PCB carrier 108, between the patterned reflowable conductive material 802.

At "B," the process includes depositing a conductive layer 202 onto the resist layer 206 and the patterned reflowable conductive material 802. In an implementation, the process also includes depositing a nonwettable layer 302 over the conductive layer 202.

At "C," the process includes patterning the nonwettable layer 302 to form nonwettable barriers 112 on the conductive layer 202. In an implementation, the process also includes applying a mask 502 to at least portions of the nonwettable barriers 112 and the conductive layer 202.

At "D," the process includes etching the conductive layer 202 to form conductive structures 102. At "E," the process includes removing the mask 502 and the resist layer 206 to form reflowable interconnects 104. In an implementation, the process also includes reflowing the reflowable conductive material (e.g., the interconnects 104) to the PCB carrier 108 (or die, package, wafer, panel, or other microelectronic element, as discussed above).

At "F," the process includes mounting an integrated circuit (IC) die 110 (or another PCB, package, wafer, panel, or other microelectronic element, as discussed above) with interconnect structures 106 onto the conductive structures 102, such that the interconnect structures 106 of the IC die 110 are located between the nonwettable barriers 112. In an implementation, the process also includes underfilling (at 504) between the IC die 110 and the PCB carrier 108.

FIG. 9 shows an example structure formed using a number of additional multi-layer interconnects 902, according to a further embodiment. For example, the additional multi-layer interconnects 902 may be added to any of the implementations previously discussed, with respect to FIGS. 1-8. In alternate implementations, the additional multi-layer interconnects 902 may be added to any chip die, PCB, substrate, component, package, or the like.

Referring to FIG. 9, in an implementation, the process includes patterning the conductive structures 102 or layer 202 to form conductive pads 606 covering the open interiors 402 of the nonwettable barriers 112. In an implementation, the process includes patterning the conductive structures 102 or layer 202 to form conductive traces 702 electrically coupling two or more of the conductive pads 606, as discussed with respect to FIG. 7.

In an implementation, the process includes depositing one or more interconnect components 904 onto the patterned conductive structure 102 or conductive pads 606, such that the one or more interconnect components 904 are located within one or more respective open interiors 402 of the nonwettable barriers 112 of the second side of the conductive structure 102. In the implementation, the one or more interconnect components 904 are arranged to couple at least a second IC die (not shown, or another PCB, package, wafer, panel, or other microelectronic element, as discussed above) to the PCB carrier 108.

In the implementation, at least one of the one or more interconnect components 904 includes an additional conductive pad 906 having at least one additional nonwettable barrier 112 with an open interior thereon, and an additional reflowable conductive material bump 910 deposited within the open interior of the additional nonwettable barrier 908.

In another implementation, the process includes depositing one or more additional reflowable conductive material bumps 912 onto the PCB carrier 108 outside the perimeter of the IC die 110, the one or more additional reflowable conductive material bumps 912 including a conductive pad 914 stacked thereon, thereby increasing a height of the one or more additional reflowable conductive material bumps 912, to couple at least a second IC die (not shown, or die, package, wafer, panel, or other microelectronic element, as discussed above) to the PCB carrier 108. Additionally, the conductive pad 914 may include a further reflowable conductive material bump 916 coupled thereon. Alternately, the reflowable conductive material bump 916 may be coupled to the second IC die (not shown) and then reflowed to the conductive pad 914.

FIG. 10 is a flow diagram illustrating an example process for forming a multi-layer interconnect (such as the multi-layer interconnect 100, for example) according to various implementations. The blocks of FIG. 10 have reference to the multi-layer interconnects 100 shown at FIG. 1.

At block 1002, the process includes depositing a non-reflowable conductive material over a first reflowable conductive material to form a first portion of the interconnect structure. At block 1004 the process includes coupling a second reflowable conductive material to the non-reflowable conductive material to form the interconnect structure.

In an implementation, the process includes coupling the second reflowable conductive material to the non-reflowable conductive material via heated reflow.

Different configurations for a multi-layer interconnect structure arrangement 100 may be possible with different implementations. In alternate implementations, various other combinations and designs of the arrangement 100 are also within the scope of the disclosure. The variations may have fewer elements than illustrated in the examples shown in FIG. 1 through FIG. 9, or they may have more or alternative elements than those shown.

The order in which the processes are described herein is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein. In alternate implementations, other techniques may be included in the processes in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method, comprising:
    applying a conductive layer to a temporary carrier;
    patterning the conductive layer to form a patterned conductive structure;
    applying a nonwettable layer to the patterned conductive structure;
    patterning the nonwettable layer to form nonwettable barriers on the patterned conductive structure;
    depositing a reflowable conductive material on the patterned conductive structure, between the nonwettable barriers, to form interconnect structures;
    mounting a first microelectronic element to the interconnect structures;
    removing the temporary carrier;
    mounting a second microelectronic element with interconnect structures onto the patterned conductive structure, on a side previously occupied by the temporary carrier; and
    coupling the IC die to the patterned conductive structure via heated reflow.

2. The method of claim 1, further comprising patterning the nonwettable layer by removing the nonwettable layer from the patterned conductive structure, except at one or more edges of the patterned conductive structure.

3. The method of claim 1, further comprising forming nonwettable barriers having closed geometric shapes with open interiors on the patterned conductive structure.

4. The method of claim 1, further comprising forming nonwettable barriers having partly-closed predefined shapes with open interiors on the patterned conductive structure.

5. The method of claim 1, wherein the nonwettable layer comprises a polymer or poly imide material.

6. A method, comprising:
    applying a nonwettable layer to a first side and a second side of a conductive layer;
    patterning the nonwettable layer to form nonwettable barriers with open interiors on the first side and the second side of the conductive layer;
    depositing a reflowable conductive material within the open interiors of the nonwettable barriers of the first side of the conductive layer to form interconnect structures;
    mounting a first microelectronic element to the interconnect structures;
    applying a patterned resist mask to the second side of the conductive layer, including over the nonwettable barriers of the second side of the conductive layer;
    patterning the conductive layer to form a patterned conductive structure, based on the patterned resist mask;
    removing the patterned resist mask; and
    mounting a second microelectronic element with interconnect structures onto the patterned conductive structure, such that the interconnect structures of the second microelectronic element are located within the open interiors of the nonwettable barriers of the second side of the conductive layer.

7. The method of claim 6, further comprising underfilling between the second microelectronic element and the first microelectronic element.

8. The method of claim 6, further comprising depositing a diffusion barrier layer to at least the first side of the conductive layer.

9. The method of claim 6, further comprising depositing a precious metal layer to at least the first side of the conductive layer.

10. The method of claim 6, further comprising supporting the conductive layer with a support layer while depositing the reflowable conductive material within the nonwettable barriers on the conductive layer.

11. The method of claim 6, further comprising underfilling around the patterned conductive structure, the interconnect structures, and/or the nonwettable barriers.

12. The method of claim 6, wherein the nonwettable barriers on the first side and/or the second side of the conductive layer are substantially elliptically shaped with open interiors.

13. The method of claim 6, further comprising patterning the conductive layer to form conductive pads covering the open interiors of the nonwettable barriers; and patterning the conductive layer to form conductive traces electrically coupling two or more of the conductive pads.

14. The method of claim 13, further comprising depositing one or more interconnect components onto the patterned conductive structure, such that the one or more interconnect components are located within one or more respective open interiors of the nonwettable barriers of the second side of the conductive layer, the one or more interconnect components arranged to couple at least a third microelectronic element to the first microelectronic element.

15. The method of claim 14, wherein at least one of the one or more interconnect components includes an additional conductive pad having at least one additional nonwettable barrier with an open interior thereon, and an additional reflowable conductive material bump deposited within the open interior of the additional nonwettable barrier.

16. The method of claim 6, further comprising depositing one or more additional reflowable conductive material bumps onto the first microelectronic element outside the perimeter of the second microelectronic element, the one or more additional reflowable conductive material bumps including a conductive pad stacked thereon, thereby increasing a height of the one or more additional reflowable conductive material bumps, to couple at least a third microelectronic element to the first microelectronic element.

17. A method, comprising:
    applying an nonwettable layer to at least a first side of a conductive layer;
    patterning the nonwettable layer to form openings in the nonwettable layer;
    patterning the conductive layer to form conductive pads covering the openings in the nonwettable layer;
    depositing a reflowable conductive material onto the conductive pads and within the openings in the nonwettable layer to form first interconnect structures;
    mounting a first microelectronic element to the first interconnect structures;
    mounting a second microelectronic element with second interconnect structures onto the conductive pads, such that the second interconnect structures of the second microelectronic element are located on the conductive pads on a side opposite of the first interconnect structures; and
    underfilling between the second microelectronic element and the first microelectronic element.

18. The method of claim 17, further comprising removing additional portions of the nonwettable layer to provide additional electrical interconnections.

19. The method of claim 17, wherein the nonwettable layer holds the conductive pads in a desired physical arrangement during processing, including during depositing the reflowable conductive material, mounting the first microelectronic element, and/or mounting the second microelectronic element.

* * * * *